(12) United States Patent
Yang et al.

(10) Patent No.: US 10,322,928 B2
(45) Date of Patent: Jun. 18, 2019

(54) MULTI-LAYER SEALING FILM FOR HIGH SEAL YIELD

(71) Applicant: Taiwan Semiconductor Manufacturing Co., Ltd., Hsin-Chu (TW)

(72) Inventors: Chih-Chien Yang, Taoyuan (TW); Ming-Lun Shih, Toufen (TW); Ren-Dou Lee, Hsinchu (TW); Jen-Hao Liu, Zhunan Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/694,176

(22) Filed: Sep. 1, 2017

(65) Prior Publication Data

US 2018/0148320 A1    May 31, 2018

Related U.S. Application Data

(60) Provisional application No. 62/427,185, filed on Nov. 29, 2016.

(51) Int. Cl.
| | | |
|---|---|---|
| *B81B 7/00* | (2006.01) | |
| *B81C 1/00* | (2006.01) | |
| *G01L 9/00* | (2006.01) | |

(52) U.S. Cl.
CPC ........ *B81B 7/0041* (2013.01); *B81C 1/00293* (2013.01); *G01L 9/008* (2013.01); *B81B 2201/0264* (2013.01); *B81B 2207/097* (2013.01); *B81C 2203/0145* (2013.01); *B81C 2203/036* (2013.01); *G01L 9/0048* (2013.01); *G01L 9/0072* (2013.01)

(58) Field of Classification Search
CPC ........ H01L 2924/00; H01L 2924/0002; H01L 2924/1461; B81C 1/00238; B81C 2203/0145; B81C 1/00333; B81C 1/00261
USPC ............... 257/E29.324, E21.613; 438/50, 52
See application file for complete search history.

(56) References Cited

U.S. PATENT DOCUMENTS

| 6,159,762 A | 12/2000 | Scheiter et al. |
| 9,656,857 B2 * | 5/2017 | Huang ...................... B81B 7/02 |
| 2002/0000653 A1 | 1/2002 | Lin et al. |

(Continued)

FOREIGN PATENT DOCUMENTS

| JP | 2011083990 A | 4/2011 |
| JP | 2016072465 A | 5/2016 |

*Primary Examiner* — Jonathan Han
(74) *Attorney, Agent, or Firm* — Eschweiler & Potashnik, LLC

(57) ABSTRACT

A multi-layer sealing film for high seal yield is provided. In some embodiments, a substrate comprises a vent opening extending through the substrate, from an upper side of the substrate to a lower side of the substrate. The upper side of the substrate has a first pressure, and the lower side of the substrate has a second pressure different than the first pressure. The multi-layer sealing film covers and seals the vent opening to prevent the first pressure from equalizing with the second pressure through the vent opening. Further, the multi-layer sealing film comprises a pair of metal layers and a barrier layer sandwiched between metal layers. Also provided is a microelectromechanical systems (MEMS) package comprising the multilayer sealing film, and a method for manufacturing the multi-layer sealing film.

20 Claims, 12 Drawing Sheets

(56) References Cited

U.S. PATENT DOCUMENTS

| | | |
|---|---|---|
| 2005/0018864 A1 | 1/2005 | Minervini |
| 2009/0190254 A1 | 7/2009 | Jandric et al. |
| 2013/0089955 A1 | 4/2013 | Baillin et al. |
| 2013/0221454 A1 | 8/2013 | Dunbar, III et al. |
| 2014/0306300 A1 | 10/2014 | Guenthner et al. |
| 2016/0060103 A1* | 3/2016 | Hung .................. B81C 1/00238 257/415 |
| 2016/0075554 A1* | 3/2016 | Huang ................ B81C 1/00285 257/417 |
| 2016/0244325 A1* | 8/2016 | Cheng ....................... B81B 7/02 |
| 2016/0332863 A1 | 11/2016 | Cheng et al. |

\* cited by examiner

MULTI-LAYER SEALING FILM FOR HIGH SEAL YIELD

REFERENCE TO RELATED APPLICATION

This application claims the benefit of U.S. Provisional Application No. 62/427,185, filed on Nov. 29, 2016, the contents of which are incorporated by reference in their entirety.

BACKGROUND

Microelectromechanical systems (MEMS) devices are microscopic devices that integrate mechanical and electrical components to sense physical quantities and/or to act upon surrounding environments. In recent years, MEMS devices have become increasingly common. For example, MEMS accelerometers are commonly found in airbag deployment systems, tablet computers, and smart phones.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
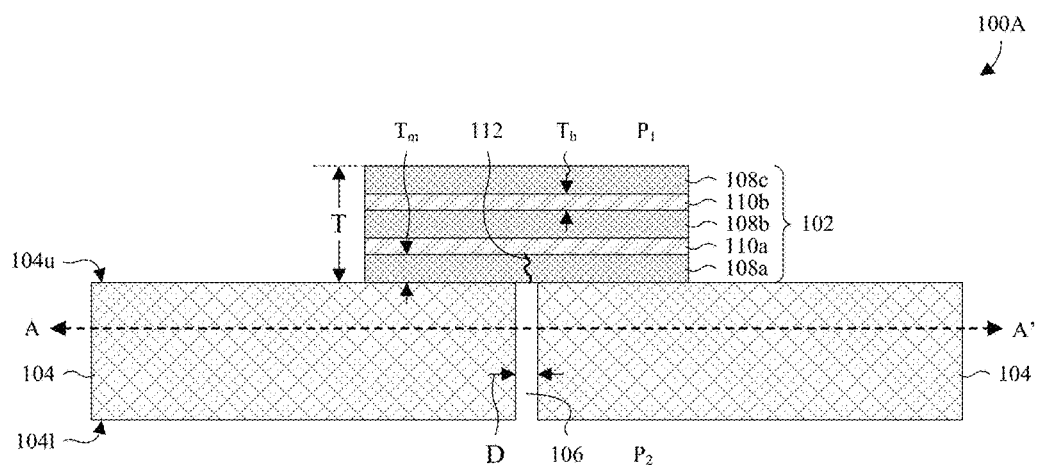
FIGS. 1A and 1B illustrate cross-sectional views of various embodiments of a semiconductor structure with a multi-layer sealing film.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Microelectromechanical systems (MEMS) devices are increasingly packaged with and electrically coupled to complementary metal-oxide-semiconductor (CMOS) devices. For example, MEMS pressure sensors are increasingly integrated with CMOS devices for use in wearable devices, such as smart watches. A MEMS pressure sensor includes a flexible membrane over a cavity hermetically sealed with a reference pressure. Assuming the reference pressure is steady, the flexible membrane deflects in proportion to a difference between an environmental pressure and the reference pressure.

A method for integrating a MEMS pressure sensor with CMOS devices comprises forming an interconnect structure covering a first substrate that supports CMOS devices. The interconnect structure comprises a plurality of wires, a plurality of vias, and a interconnect dielectric layer within which the wires and the vias are alternatingly stacked. A first etch is performed into the interconnect dielectric layer to form a cavity over the first substrate and the CMOS devices, and a second substrate is fusion bonded to the first substrate through the interconnect dielectric layer. The fusion bonding is limited to hermetically sealing the cavity with a high reference pressure (e.g., 500 millibars or greater), which may be unsuitable for certain applications. Therefore, to hermetically seal the cavity with a low reference pressure (e.g., 10 millibars or less), a second etch is performed through the second substrate to form a vent opening that opens the cavity. Further, a single, ultra-thick-metal (UTM) layer is deposited at the low reference pressure to cover and seal the vent opening.

A challenge with sealing the vent opening with the single, UTM layer is that a seam has a high likelihood of forming along metal grain boundaries of the UTM layer. The seam allows air to pass through the single, UTM layer to the cavity, which increases the reference pressure of the cavity beyond allowable limits and leads to failure of the seal. This, in turn, reduces yields during bulk manufacture and increases costs.

In view of the foregoing, various embodiments of the present application are directed towards a multi-layer sealing film for high seal yield. In some embodiments, a MEMS package comprises a first substrate supporting semiconductor devices. A interconnect structure covers the first substrate and the semiconductor devices. The interconnect structure comprises a dielectric layer, and the dielectric layer comprises a cavity that is hermetically sealed. A second substrate covers the cavity. The second substrate comprises a vent opening extending through the second substrate, from an upper side of the second substrate to the cavity. A multi-layer sealing film covers the vent opening, and further seals the vent opening and the cavity. The multi-layer sealing film comprises a first metal layer and a second metal layer over the first metal layer, and further comprises a barrier layer between the first and second metal layers.

Advantageously, the barrier layer stops or limits a seam along grain boundaries of the first metal layer from extending through an entire thickness of the multi-layer sealing film. For example, the barrier layer may be a metal or ceramic material having smaller grains (or crystallites) than the metal layers. The smaller grains, in turn, increases the density of grains in the barrier layer and decreases the size of boundaries between the grains. This causes the grain boundaries (e.g., the whole metal grain boundary) to become discontinuous, thereby stopping or limiting the seam at the barrier layer, and preventing air or other gases from passing through the multi-layer sealing film to the cavity. Therefore, the cavity may be sealed with and maintain a low reference pressure (e.g., about 10 millibars or less), yields may be high (e.g., greater than 99%) during bulk manufacture, and costs may be low. Even more, the first and second metal layers may have a small thickness, thereby leading to low material costs.

With reference to FIG. 1A, a cross-sectional view 100A of some embodiments of a semiconductor structure with a multi-layer sealing film 102 is provided. As illustrated, the multi-layer sealing film 102 is over a substrate 104, on an upper side 104u of the substrate 104. The substrate 104 may be, for example, a bulk semiconductor substrate, such as bulk substrate of monocrystalline or polycrystalline silicon, or some other type of substrate. Further, the multi-layer sealing film 102 covers and seals a vent opening 106 defined by the substrate 104.

The vent opening 106 extends from the upper side 104u of the substrate 104, through the substrate 104, to a lower side 104l of the substrate 104 that is opposite the upper side 104u. The upper side 104u of the substrate 104 has a first pressure $P_1$, and the lower side 104l of the substrate 104 has a second pressure $P_2$ that is different than the first pressure $P_1$. For example, the first pressure $P_1$ may be greater than the second pressure $P_2$, or vice versa. By sealing the vent opening 106, the multi-layer sealing film 102 advantageously prevents the first pressure $P_1$ from equalizing with the second pressure $P_2$ through the vent opening 106.

In some embodiments, a minimum dimension D of the vent opening 106 is less than about two times a thickness T of the multi-layer sealing film 102 so the multi-layer sealing film 102 does not collapse into the vent opening 106. The minimum dimension D may be, for example, between about 0.1-2.0 micrometers, about 0.05-3.5 micrometers, or about 0.5-1.5 micrometers. The thickness T may be, for example, between about 2.5-3.5 micrometers, about 3.0-3.3 micrometers, or about 1.5-4.0 micrometers.

The multi-layer sealing film 102 comprises a first metal layer 108a, a first barrier layer 110a, a second metal layer 108b, a second barrier layer 110b, and a third metal layer 108c. The first metal layer 108a is over and, in some embodiments, contacts the substrate 104. The first barrier layer 110a is over and, in some embodiments, contacts the first metal layer 108a. The second metal layer 108b is over and, in some embodiments, contacts the first barrier layer 110a. The second barrier layer 110b is over and, in some embodiments, contacts the second metal layer 108b. The third metal layer 108c is over and, in some embodiments, contacts the second barrier layer 110b. In some embodiments, the first, second, and third metal layers 108a-108c and the first and second barrier layers 110a, 110b have the same layout.

The first, second, and third metal layers 108a-108c are metals with grain sizes larger than those of the first and second barrier layers 110a, 110b, and the first and second barrier layers 110a, 110b are metals or ceramics that have grain sizes smaller than those of the first, second, and third metal layers 108a-108c. For example, the first, second, and third metal layers 108a-108c may be aluminum copper, copper, or some other metal, and the first and second barrier layers 110a, 110b may be titanium nitride, titanium tungsten, tungsten nitride, tantalum nitride, or some other metal material.

After the multi-layer sealing film 102 is formed, a seam 112 may form at the vent opening 106, along grain boundaries of the first metal layer 108a. The first and second barrier layers 110a, 110b advantageously stop or limit the seam 112 from extending completely through the thickness T of the multi-layer sealing film 102, along grain boundaries of the first, second, and third metal layers 108a-108c. By stopping or limiting the seam 112, the multi-layer sealing film 102 advantageously prevents or limits the likelihood of the first pressure $P_1$ equalizing with the second pressure $P_2$ through the vent opening 106. Accordingly, yield may be high during bulk manufacture of the semiconductor structure, and the reliability of the multi-layer sealing film 102 may be high. Further, by stopping or limiting the seam 112, the thickness T of the multi-layer sealing film 102 may advantageously be small.

In some embodiments, the first, second, and third metal layers 108a-108c are the same material. In other embodiments, the first, second, and third metal layers 108a-108c are different materials. In yet other embodiments, some of the first, second, and third metal layers 108a-108c are the same material and some of the first, second, and third metal layers 108a-108c are different materials. For example, the first and second metal layers 108a, 108b may be aluminum copper, and the third metal layer 108c may be elemental copper. Further, in some embodiments, the first, second, and third metal layers 108a-108c are pure metals or metal alloys limited to elemental metals. For example, the first, second, and third metal layers 108a-108c may be elemental copper, elemental aluminum, aluminum copper, or a combination of the foregoing.

In some embodiments, individual thicknesses $T_m$ of the first, second, and third metal layers 108a-108c are the same. In other embodiments, the individual thicknesses $T_m$ of the first, second, and third metal layers 108a-108c are different. In yet other embodiments, some of the individual thicknesses $T_m$ of the first, second, and third metal layers 108a-108c are the same and some of the individual thicknesses $T_m$ of the first, second, and third metal layers 108a-108c are different. For example, the first and third metal layers 108a, 108c may have the same thickness, and the second metal layer 108b may have a different thickness. Further, in some embodiments, the individual thicknesses $T_m$ of the first, second, and third metal layers 108a-108c are each between about 0.75-1.25 micrometers, about 1.0-2.0 micrometers, about 0.5-3.0 micrometers, or about 1.25-1.75 micrometers. For example, the individual thicknesses $T_m$ of the first, second, and third metal layers 108a-108c may each be about 1 micrometer.

In some embodiments, the first and second barrier layers 110a, 110b are conductive and block the diffusion of material from the first, second, and third metal layers 108a-108c through the first and second barrier layers 110a, 110b. For example, where the first, second, and third metal layers 108a-108c include copper, the first and second barrier layers 110a, 110b may block the diffusion of copper through the first and second barrier layers 110a, 110b. In some embodiments, the first and second barrier layers 110a, 110b are the same material. In other embodiments, the first and second barrier layers 110a, 110b are different materials.

In some embodiments, individual thicknesses $T_b$ of the first and second barrier layers 110a, 110b are the same. In other embodiments, the individual thicknesses $T_b$ of the first and second barrier layers 110a, 110b are different. Further, in some embodiments, the individual thicknesses $T_b$ of the first and second barrier layers 110a, 110b are each between about 500-2000 angstroms, about 1100-1500 angstroms, or about 1250-1750 angstroms. Further yet, in some embodiments, the individual thicknesses $T_b$ of the first and second barrier layers 110a, 110b are each less than the individual thicknesses $T_m$ of the first, second, and third metal layers 108a-108c. For example, where the individual thicknesses $T_m$ of the first, second, and third metal layers 108a-108c are about 1 or 1.5 micrometers, the individual thicknesses $T_b$ of the first and second barrier layers 110a, 110b may be about 1500 angstroms.

Figure 1B:
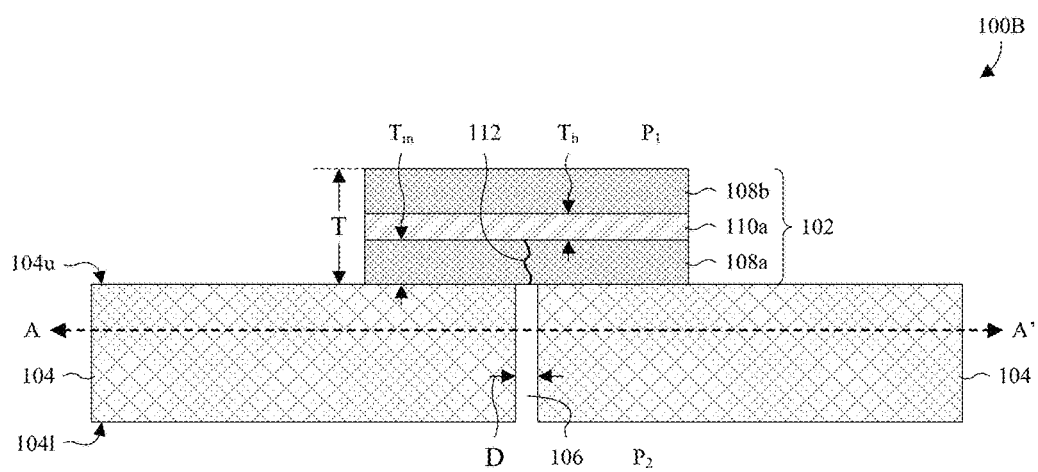

With reference to FIG. 1B, a cross-sectional view 100B of some other embodiments of the semiconductor structure of FIG. 1A is provided. As illustrated, the second barrier layer 110b of FIG. 1A and the third metal layer 108c of FIG. 1A are omitted. In some embodiments, the thickness T of the multi-layer sealing film 102 is between about 2.5-3.5 micrometers, about 3.0-3.3 micrometers, or about 1.5-4.0 micrometers. Further, in some embodiments, the individual thickness $T_b$ of the first barrier layer 110a is about 1100-2000 angstroms, about 1250-1750 angstroms, or 1500-1700 angstroms, and/or the individual thicknesses $T_m$ of the first and second metal layers 108a, 108b are each about 1.0-2.0 micrometers, about 1.25-1.75 micrometers, or about 1.6-1.7 micrometers. For example, the individual thickness $T_b$ of the first barrier layer 110a may be about 1500 angstroms, and the individual thicknesses $T_m$ of the first and second metal layers 108a, 108b may be about 1.5 micrometers.

While FIGS. 1A and 1B illustrate the multi-layer sealing film 102 respectively with two and three metal layers, and respectively with one and two barrier layers, the multi-layer sealing film 102 may have four or more metal layers and three or more barrier layers in other embodiments. In such embodiments, the four or more metal layers and the three or more barrier layers are alternatingly stacked with the same alternating pattern shown in FIGS. 1A and 1B.

Figure 2A:
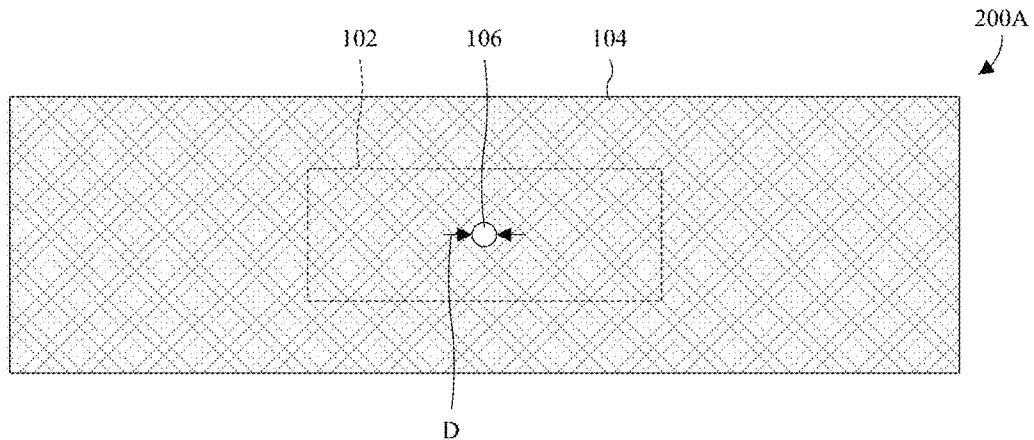
FIGS. 2A and 2B illustrate top views of various embodiments of the semiconductor structure of FIGS. 1A and 1B.
Figure 2B:
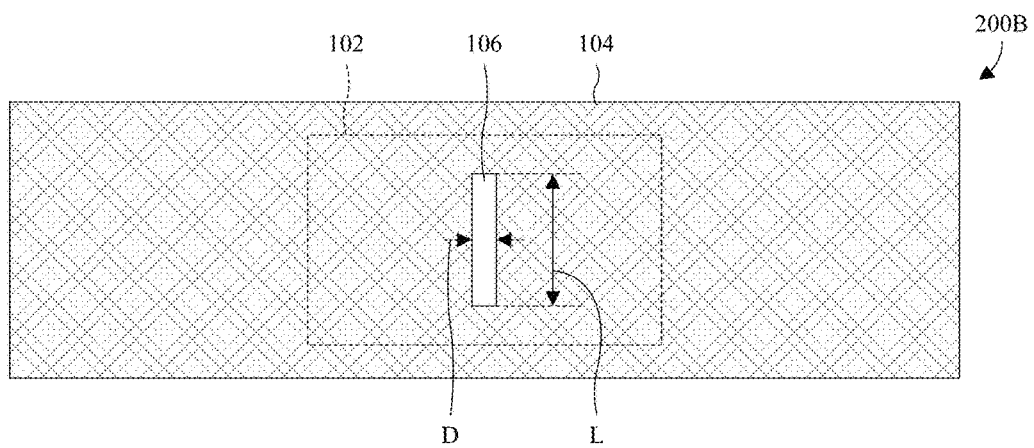

With reference to FIGS. 2A and 2B, top views 200A, 200B of various embodiments of the semiconductor structure of FIGS. 1A and 1B are provided. The top views 200A, 200B may, for example, be taken along line A-A' in FIG. 1A or FIG. 1B. As illustrated by the top view 200A of FIG. 2A, the vent opening 106 is circular, and the minimum dimension D of the vent opening 106 is a diameter of the vent opening 106. Further, the multi-layer sealing film 102 (shown in phantom) completely covers the vent opening 106. As illustrated by the top view 200B of FIG. 2B, the vent opening 106 is laterally elongated, and the minimum dimension D of the vent opening 106 is orthogonal to a length L of the vent opening 106. Further, as in FIG. 2A, the multi-layer sealing film 102 (shown in phantom) completely covers the vent opening 106.

Figure 3:
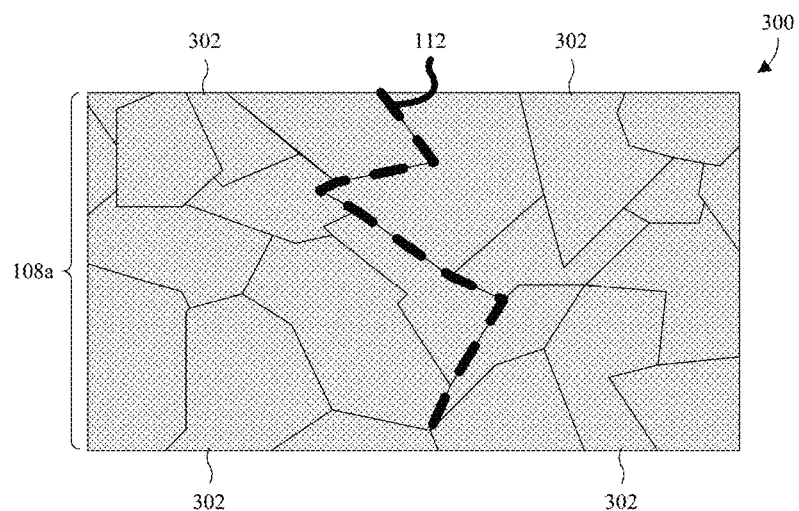
FIG. 3 illustrates an enlarged cross-sectional view of some embodiments of a seam in the multi-layer sealing film of FIGS. 1A and 1B.

With reference to FIG. 3, an enlarged cross-sectional view 300 of some embodiments of the seam 112 in the multi-layer sealing film 102 of FIGS. 1A and 1B is provided. As illustrated, the first metal layer 108a comprises metal grains 302. For ease of illustration, only some of the metal grains 302 are labeled 302. Further, the seam 112 extends through the first metal layer 108a, along boundaries of the metal grains 302.

Figure 4A:
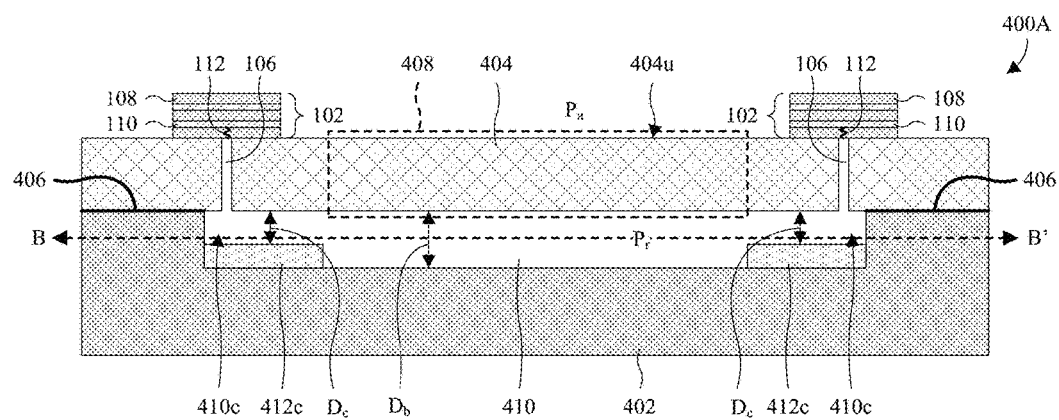
FIGS. 4A-4C illustrate various views of some embodiments of a MEMS package with a multi-layer sealing film.

With reference to FIG. 4A, a cross-sectional view 400A of some embodiments of a MEMS package comprising a pair of multi-layer sealing films 102 is provided. As illustrated, a support structure 402 underlies and is bonded to a MEMS substrate 404. In some embodiments, the support structure 402 is bonded to the MEMS substrate 404 at a bond interface 406 between a top surface of the support structure 402 and a bottom surface of the MEMS substrate 404. The bond interface 406 may be, for example, planar. In some embodiments, the support structure 402 is a bulk semiconductor substrate or an integrated circuit (IC).

The MEMS substrate 404 overlies the support structure 402 and comprises a MEMS device 408. The MEMS substrate 404 may be or comprise, for example, monocrystalline silicon, polycrystalline silicon, amorphous silicon, aluminum copper, oxide, silicon nitride, a piezoelectric material, some other material, or a combination of the foregoing. In some embodiments, the MEMS substrate 404 is a bulk substrate of monocrystalline silicon. In other embodiments, the MEMS substrate 404 is or otherwise comprises a piezoelectric layer, such as, for example, lead zirconate titanate (PZT) or aluminum nitride (AlN). The MEMS device 408 is spaced over the support structure 402 by a cavity 410 between the MEMS substrate 404 and the support structure 402, and may be, for example, a pressure sensor. The cavity 410 is hermetically sealed with a reference pressure $P_r$ and is recessed into the support structure 402. The reference pressure $P_r$ may be, for example, less than about 0.01, 0.1, 1, 10, 100, 250, or 500 millibars, and/or may be, for example, between about 0.001-10.000 millibars, about 0.001-1.000 millibars, about 0.01-1 millibars, or about 1-10 millibars.

In operation, the MEMS device 408 moves within the cavity 410 in proportion to a pressure difference between the reference pressure $P_r$ and an ambient pressure $P_a$ of the MEMS package. Further, since the reference pressure $P_r$ is fixed, the MEMS device 408 moves within the cavity 410 in proportion to the ambient pressure $P_a$. Therefore, the movement of the MEMS device 408 may be measured to sense the ambient pressure $P_a$. In some embodiments, the movement of the MEMS device 408 is measured using capacitive coupling between the MEMS device 408 and a fixed electrode (not shown) neighboring the MEMS device 408. In other embodiments where the MEMS substrate 404 is or otherwise comprises a piezoelectric layer, the movement of the MEMS device 408 is measured using the Piezoelectric Effect.

The MEMS substrate 404 further comprises a pair of vent openings 106. The vent openings 106 are on opposite sides of the cavity 410 and extend from the upper side 404u of the MEMS substrate 404, through the MEMS substrate 404, to the cavity 410. In some embodiments, the vent openings 106 are each as described in FIG. 1A or 1B and/or in FIG. 2A or 2B. In some embodiments, the vent openings 106 define the only paths by which the reference and ambient pressures $P_r$, $P_a$ may equalize.

In some embodiments, the cavity 410 comprises a pair of channels 410c. The channels 410c are on the opposite sides of the cavity 410 and respectively underlie the vent openings 106. Further, in some embodiments, the channels 410c overlie a pair of channel pads 412c. The channels 410c are regions of the cavity 410 that have a channel depth $D_c$ less than a bulk depth $D_b$ of the cavity 410, and that further have a channel width less than a bulk width of the cavity 410. The channel and bulk widths extend into and out of the cross-sectional view 400A of FIG. 4A, whereby the channel and bulk widths are not visible in the cross-sectional view 400A of FIG. 4A. However, examples of the channel and bulk widths are illustrated in the top view 400B of FIG. 4B. The channel pads 412c respectively underlie the channels 410c and may be, for example, aluminum copper, copper, aluminum, or some other metal.

The multi-layer sealing films 102 are over the MEMS substrate 404, and respectively cover the vent openings 106 to seal the vent openings 106 and the cavity 410. By sealing the vent openings 106 and the cavity 410, the multi-layer sealing films 102 advantageously prevent the ambient pressure $P_a$ from equalizing with the reference pressure $P_r$ through the vent openings 106. The multi-layer sealing films 102 are each as described in FIG. 1A or 1B. Further, the multi-layer sealing films 102 each comprise a plurality of metal layers 108 and one or more barrier layers 110. For ease of illustration, only some of the metal layers 108 are labeled 108, and only some of the barrier layers 110 are labeled 110.

The metal layers 108 and the barrier layer(s) 110 are alternatingly stacked, examples of which are shown in FIGS. 1A and 1B. Further, the metal layers 108 are metals with grain sizes larger than those of the barrier layer(s) 110, and the barrier layer(s) 110 are metals or ceramics that have grain sizes smaller than those of the metal layers 108. For example, the metal layers 108 may be aluminum copper, copper, aluminum, or some other metal, and the the barrier layer(s) 110 may be titanium nitride, titanium tungsten, tungsten nitride, tantalum nitride, or some other barrier material.

After the multi-layer sealing films 102 are formed, seams 112 may form at the vent openings 106. The barrier layer(s) 110 advantageously stop or limit the seams 112 from extending completely through the multi-layer sealing films 102. By stopping or limiting the seams 112, the multi-layer sealing films 102 advantageously prevent or limit the likelihood of the ambient pressure $P_a$ equalizing with the reference pressure $P_r$ through the vent openings 106. Accordingly, yield may be high during bulk manufacture of the MEMS package, and the reliability of the multi-layer sealing films 102 may be high.

Figure 4B:
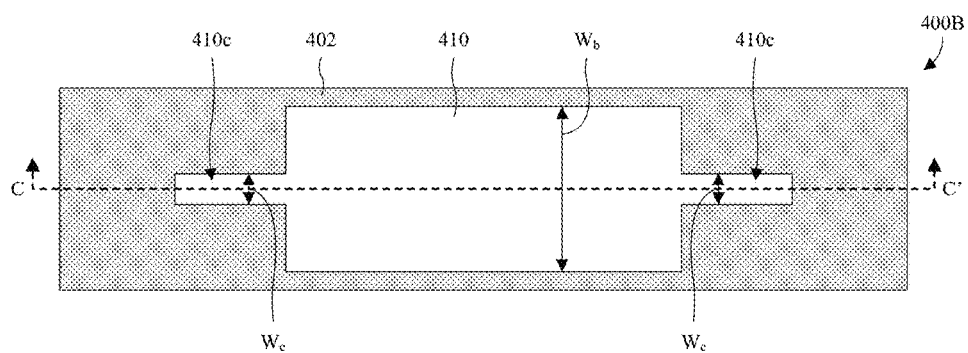

With reference to FIG. 4B, a top view 400B of some embodiments of the MEMS package of FIG. 4A is provided. The top view 400B may, for example, be taken along line B-B' in FIG. 4A. As illustrated, the channels 410c of the cavity 410 are on opposite sides of the cavity 410 and have channel widths $W_c$ that are less than a bulk width $W_b$ of the cavity 410. Further, in some embodiments, the channels 410c are at a width-wise center of the cavity 410.

Figure 4C:
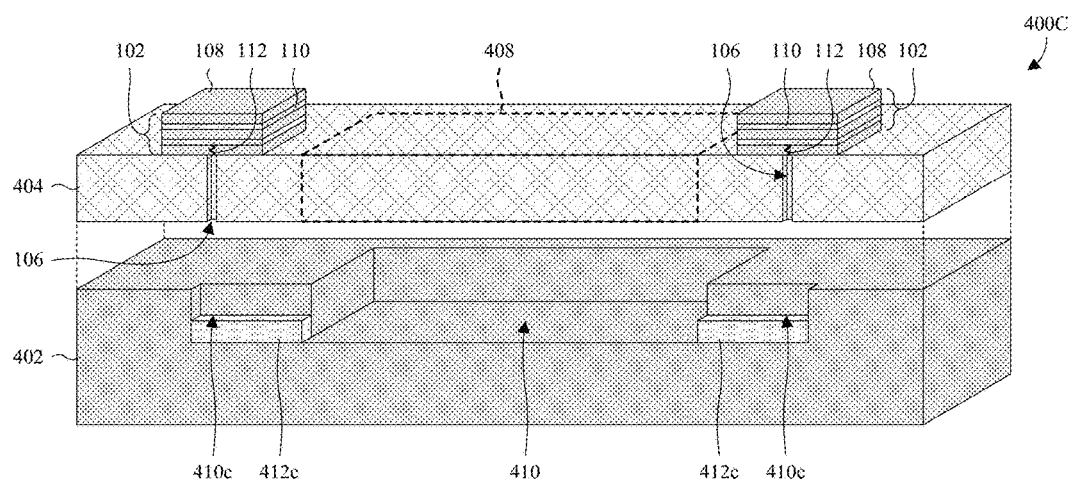

With reference to FIG. 4C, an exploded perspective view 400C of the MEMS package of FIG. 4A is provided. FIG. 4C is "exploded" in that the MEMS substrate 404 is separated from the support structure 402 on which the MEMS substrate 404 normally rests. The exploded perspective view 400C may, for example, be taken along line C-C' in FIG. 4B.

While FIGS. 4A-4C illustrate the multi-layer sealing films 102 according to the embodiments of FIG. 1A, it is to be understood that the multi-layer sealing films 102 may be according to the embodiments of FIG. 1B in other embodiments. Further, the multi-layer sealing films 102 may have more or less metal layers in other embodiments, and/or more or less barrier layers in other embodiments. Also, while FIGS. 4A-4C illustrate the MEMS package with two vent openings, two channel pads, and two channels, it is to be understood that the MEMS package may have more or less vent openings, more or less channel pads, and more or less channels in other embodiments.

Figure 5:
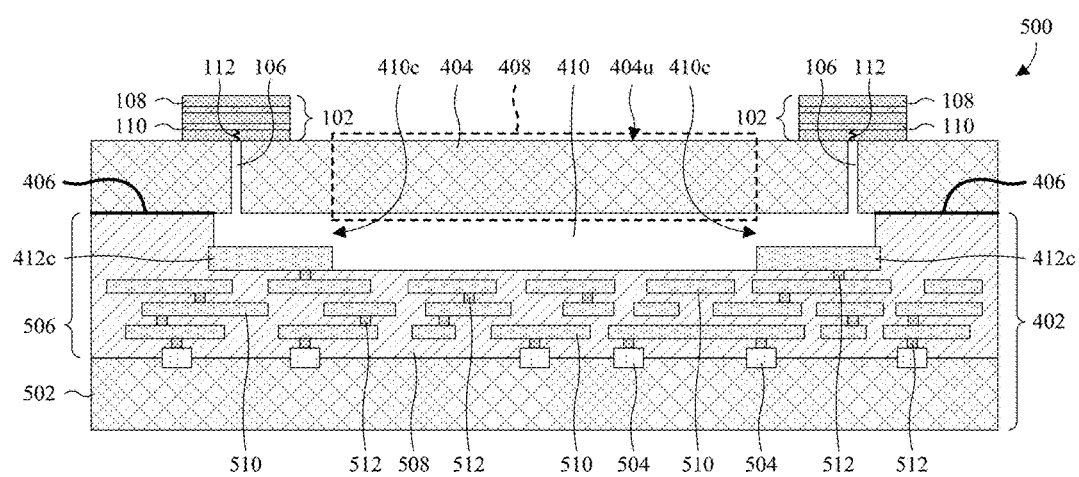
FIG. 5 illustrates a cross-sectional view of some more detailed embodiments of the MEMS package of FIGS. 4A-4C.

With reference to FIG. 5, a cross-sectional view 500 of some more detailed embodiments of the MEMS package of FIGS. 4A-4C is provided. As illustrated, the support structure 402 comprises a semiconductor substrate 502, a plurality of semiconductor devices 504, and an interconnect structure 506. For ease of illustration, only some of the semiconductor devices 504 are labeled 504. The semiconductor devices 504 are over the semiconductor substrate 502, recessed into a top of the semiconductor substrate 502. The semiconductor devices 504 may be, for example, insulated-gate field-effect transistors (IGFETs), complementary metal-oxide-semiconductor (CMOS) devices, or some other type of semiconductor device. The semiconductor substrate 502 may be, for example, a bulk substrate of monocrystalline silicon or some other type of semiconductor substrate.

The interconnect structure 506 covers the semiconductor devices 504 and the semiconductor substrate 502, and electrically couples the semiconductor devices 504 to one another and/or to the MEMS device 408. The interconnect structure 506 comprises an interconnect dielectric layer 508, as well as a plurality of wires 510, a plurality of vias 512, and the channel pads 412c. For ease of illustration, only some of the wires 510 are labeled 510, and only some of the vias 512 are labeled 512. The interconnect dielectric layer 508 may be, for example, silicon dioxide, silicon nitride, a low κ dielectric, some other dielectric, or a combination of the foregoing. As used herein, a low κ dielectric is a dielectric with a dielectric constant κ less than about 3.9, 3.0, 2.0, or 1.0

The wires 510, the vias 512, and the channel pads 412c are stacked in the interconnect dielectric layer 508, and define conductive paths between the semiconductor devices 504 and the MEMS device 408. In some embodiments, the wires 510 are alternatingly stacked with the vias 512, and/or the channel pads 412c are at the top of the interconnect structure 506. In some embodiments, some or all of the vias 512 each extend vertically from one of the wires 510 to another one of the wires 510, one of the channel pads 412c, or one of the semiconductor devices 504. In some embodiments, some or all of the wires 510 each extend laterally from one of the vias 512 to another one of the vias 512. The wires 510, the vias 512, and the channel pads 412c are conductive and may be, for example, aluminum copper, copper, aluminum, tungsten, some other conductive material, or a combination of the foregoing.

The MEMS substrate 404 is over the interconnect structure 506, and is bonded to the interconnect structure 506 at the bond interface 406. In some embodiments, the bond interface 406 is between the MEMS substrate 404 and the interconnect dielectric layer 508. The MEMS substrate 404 comprises the MEMS device 408. The MEMS device 408 is spaced over the interconnect structure 506 by the cavity 410 and is electrically coupled to the semiconductor devices 504 by the interconnect structure 506. Note that electrical paths between the semiconductor devices 504 and the MEMS device 408 are not fully shown. The cavity 410 is hermetically sealed and, in some embodiments, is recessed into the interconnect dielectric layer 508. Further, the MEMS substrate 404 comprises the vent openings 106 on opposite sides of the cavity 410, which are respectively covered by the multi-layer sealing films 102.

Seams 112 may form at the vent openings 106, along grain boundaries of the metal layers 108 of the multi-layer sealing films 102. The barrier layers 110 advantageously stop or limit the seams 112 from extending completely through the multi-layer sealing films 102. By stopping or limiting the seams 112, the multi-layer sealing films 102 advantageously prevent or limit the likelihood of the pressure in the cavity 410 equalizing with an ambient pressure of the MEMS package through the vent openings 106. Accordingly, yield may be high (e.g., greater than 99%) during bulk manufacture of the MEMS package, and the reliability of the multi-layer sealing films 102 may be high. Further, the multi-layer sealing films 102 may have a small thickness, thereby leading to low material costs.

Figure 6A:
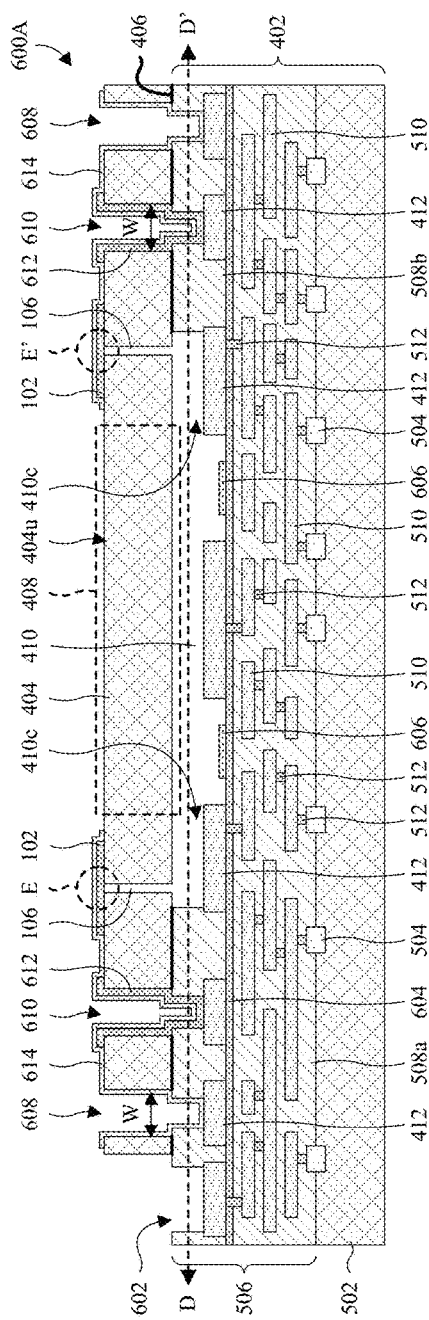
FIGS. 6A-6C illustrate various views of some more detailed embodiments of the MEMS package of FIG. 5.

With reference to FIG. 6A, a cross-sectional view 600A of some more detailed embodiments of the MEMS package of FIG. 5 is provided. As illustrated, the support structure 402 comprises the semiconductor substrate 502, the plurality of semiconductor devices 504, and the interconnect structure 506. For ease of illustration, only some of the semiconductor devices 504 are labeled 504. The semiconductor devices 504 are recessed into a top of the semiconductor substrate 502, and the interconnect structure 506 covers the semiconductor devices 504 and the semiconductor substrate 502.

The interconnect structure 506 comprises a first interconnect dielectric layer 508a and a second interconnect dielectric layer 508b, as well as the plurality of wires 510, the plurality of vias 512, and a plurality of pads 412. For ease of illustration, only some of the wires 510 are labeled 510, only some of the vias 512 are labeled 512, and only some of the pads 412 are labeled 412. The second interconnect dielectric layer 508b covers the first interconnect dielectric layer 508a. Further, the first interconnect dielectric layer 508a and the second interconnect dielectric layer 508b may be, for example, silicon dioxide, silicon nitride, a low κ dielectric, some other dielectric, or a combination of the foregoing.

The wires 510, the vias 512, and the pads 412 are stacked in the first and second interconnect dielectric layers 508a, 508b. In some embodiments, the wires 510 are alternatingly stacked with the vias 512, and/or the pads 412 are at the top of the interconnect structure 506. Further, in some embodiments, one or more of the pads 412 are exposed by one or more respective pad openings 602 in the second interconnect dielectric layer 508b. The wires 510, the vias 512, and the pads 412 are conductive and may be, for example, aluminum copper, copper, aluminum, tungsten, some other conductive material, or a combination of the foregoing.

In some embodiments, the interconnect structure 506 further comprises an outgassing prevention layer 604 between the first and second interconnect dielectric layers 508a, 508b. The outgassing prevention layer 604 may, for example, prevent gases from outgassing thereunder to the cavity 410 overlying the outgassing prevention layer 604. The outgassing prevention layer 604 may, for example, have a gas permissibility lower than that of the first interconnect dielectric layer 508a. Further, the outgassing prevention layer 604 may, for example, be employed as an etch stop layer during formation of the cavity 410. In some embodiments, the outgassing prevention layer 604 is silicon nitride, silicon oxynitride, silicon carbide, silicon oxycarbide, silicon carbon nitride, or a combination the foregoing.

The MEMS substrate 404 is over the interconnect structure 506, and is bonded to the interconnect structure 506 at the bond interface 406. The MEMS substrate 404 comprises the MEMS device 408 and the vent openings 106. The MEMS device 408 is spaced over the interconnect structure 506 by the cavity 410 and is electrically coupled to the semiconductor devices 504 by the interconnect structure 506. The vent openings 106 extend through the MEMS substrate 404, from the upper side 404u of the MEMS substrate 404 to the cavity 410. In some embodiments, the vent openings 106 overlie respective ones of the pads 412 in the cavity 410.

The multi-layer sealing films 102 cover the vent openings 106, and seal the vent openings 106 and the cavity 410, so a pressure in the cavity 410 does not equalize with an ambient pressure of the MEMS package through the vent openings 106. The multi-layer sealing films 102 are each configured as shown in FIG. 1A or 1B, and each include a plurality of metal layers (not shown) and one or more barrier layers (not shown) alternatingly stacked with the metal layers. As discussed above, the barrier layer(s) advantageously stop seems that may develop at the vent openings 106 from extending through the multi-layer sealing films 102 and breaking the seal of the vent openings 106 and the cavity 410.

In some embodiments, one or more gas getter structures 606 are in the cavity 410. The gas getter structure(s) 606 are configured to absorb gases within the cavity 410. The gas getter structure 606 are or comprise, for example, barium, aluminum, magnesium, calcium, sodium, strontium, cesium, phosphorus, platinum, titanium, some other getter material, or a combination of the foregoing.

In some embodiments, a trench 608 and/or a plurality of via openings 610 extend(s) vertically into the MEMS substrate 404 and the second interconnect dielectric layer 508b. In some embodiments, the trench 608 and/or the via openings 610 each have a width W that discretely tapers at the bond interface 406 between the MEMS substrate 404 and the second interconnect dielectric layer 508b. Further, in some embodiments, the trench and/or the via openings 610 each extend to and stop on a respective one of the pads 412. The trench 608 comprises a pair of segments (not labeled) respectively on opposite sides of the cavity 410 and, in some embodiments, the via openings 610 are spaced between the segments.

In some embodiments, a plurality of through substrate vias (TSVs) 612 are respectively in the via openings 610. In some embodiments, the TSVs 612 conformally line the via openings 610 so as to only partially fill the via openings 610. Further, in some embodiments, the TSVs 612 electrically couple the MEMS device 408 to the interconnect structure 506. The TSVs 612 may, for example, have the same structure as the multi-layer sealing films 102. That is to say, the TSVs 612 may, for example, comprise a plurality of metal layers and one or more barrier layers alternatingly stacked with the metal layers. Examples of such alternating stacking are shown in FIGS. 1A and 1B with regard to the multi-layer sealing film 102. Further, the TSVs 612 may, for example, comprise copper, aluminum, aluminum copper, titanium nitride, tantalum nitride, some other conductive material, or a combination of the foregoing.

In some embodiments, a passivation layer 614 covers and conformally lines the trench 608 and/or the TSVs 612. The passivation layer 614 prevents gases and/or moisture from diffusing from the ambient environment of the MEMS package to the cavity 410, and vice versa. In some embodiments, the passivation layer 614 is silicon nitride, silicon dioxide, silicon oxynitride, or some other dielectric layer.

Figure 6B:
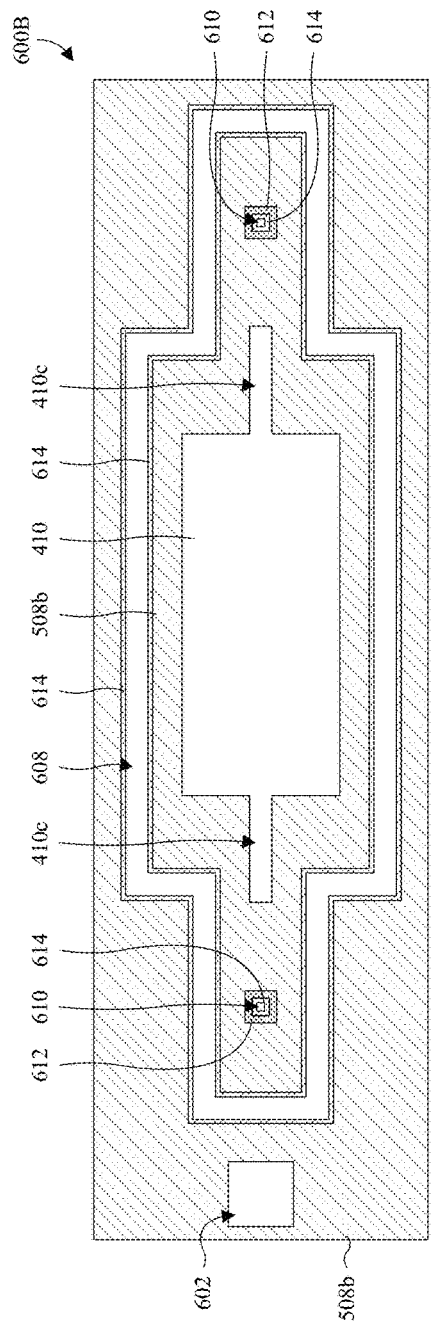

With reference to FIG. 6B, a top view 600B of some embodiments of the MEMS package of FIG. 6A is provided. The top view 600B may, for example, be taken along line D-D' in FIG. 6A. As illustrated, the trench 608 extends laterally to completely enclose the cavity 410 and, in some embodiments, the TSVs 612. Further, in some embodiments, the trench 608 conforms to the cavity 410 while remaining spaced from the cavity 410. Further yet, in some embodiments, the via openings 610 have, for example, a square layout, a rectangular layout, a triangular layout, a circular layout, or some other layout.

Figure 6C:
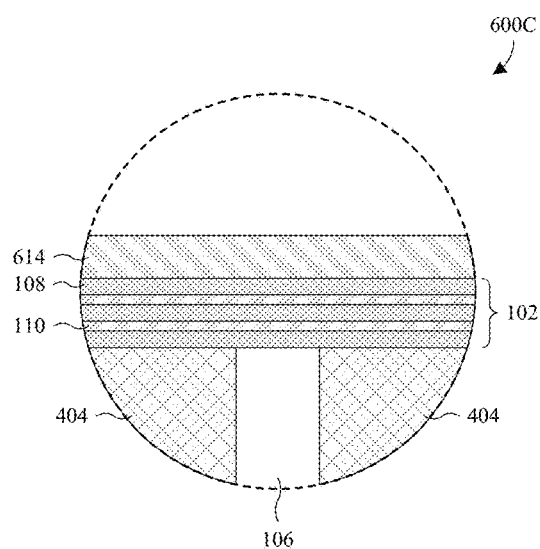

With reference to FIG. 6C, an enlarged, partial cross-sectional view 600C of the MEMS package of FIG. 6A is provided. The enlarged, partial cross-sectional view 600C may, for example, correspond to circle E in FIG. 6A or circle E' in FIG. 6A. As illustrated, the multi-layer sealing films 102 each comprise a plurality of metal layers 108 and one or more barrier layers 110. The metal layers 108 and the barrier layer(s) 110 are alternatingly stacked, examples of which are shown in FIGS. 1A and 1B. Further, the metal layers 108 are metals with grain sizes larger than those of the barrier layer(s) 110, and the barrier layer(s) 110 are metals or ceramics with grain sizes smaller than those of the metal layers 108.

With reference to FIGS. 7-11, 12A, 12B, 13A, and 13B, a series of cross-sectional views 700-1100, 1200A, 1200B, 1300A, 1300B of some embodiments of a method for manufacturing a MEMS package with a multi-layer sealing film is provided. Such embodiments may, for example, be employed to manufacture the MEMS package of FIG. 5.

Figure 7:
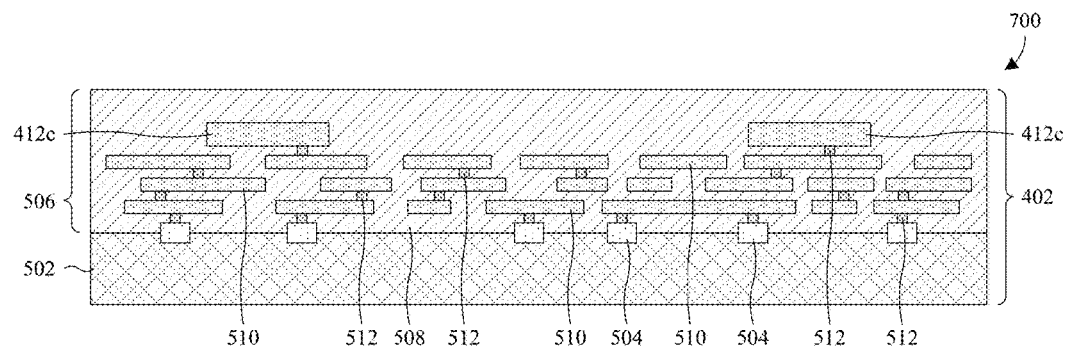
FIGS. 7-11, 12A, 12B, 13A, and 13B illustrate a series of cross-sectional views of some embodiments of a method for manufacturing a MEMS package with a multi-layer sealing film.

As illustrated by the cross-sectional view 700 of FIG. 7, a support structure 402 is provided or otherwise formed. The support structure 402 is an IC and comprises a semiconductor substrate 502, a plurality of semiconductor devices 504, and an interconnect structure 506. For ease of illustration, only some of the semiconductor devices 504 are labeled 504. The semiconductor devices 504 are recessed into a top of the semiconductor substrate 502, and the interconnect structure 506 covers the semiconductor substrate 502 and the semiconductor devices 504. The semiconductor devices 504 may be or include, for example, CMOS devices or other types of semiconductor devices. The interconnect structure 506 comprises an interconnect dielectric layer 508, and further comprises wires 510, vias 512, and a pair of channel pads 412c stacked in in the interconnect dielectric layer 508. For ease of illustration, only some of the wires 510 are labeled 510, and only some of the vias 512 are labeled 512. In some embodiments, the channel pads 412c are at a top of the interconnect dielectric layer 508.

Figure 8:
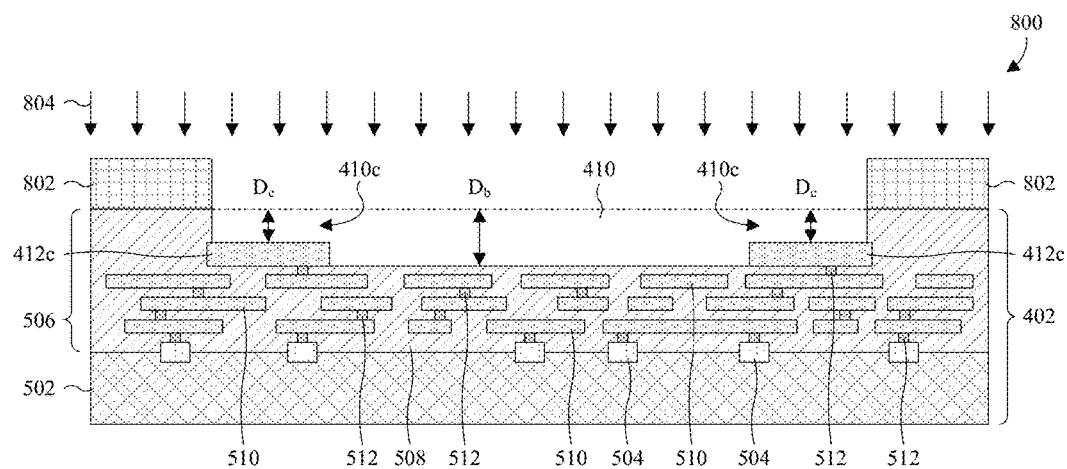

As illustrated by the cross-sectional view 800 of FIG. 8, a first etch is performed into the interconnect dielectric layer 508 to form a cavity 410 in the interconnect dielectric layer 508. An example layout of the cavity 410 is illustrated in FIG. 4B. The cavity 410 is formed with a pair of channels 410c on opposite sides of the cavity 410. The channels 410c are laterally elongated and have a channel depth $D_c$ that is less than a bulk depth $D_b$ of the cavity 410. The channels 410c further respectively overlie the channel pads 412c.

In some embodiments, a process for performing the first etch comprises forming a patterned photoresist layer 802 on the interconnect dielectric layer 508. The patterned photoresist layer 802 is formed with an opening corresponding to the cavity 410 and may, for example, be patterned with photolithography. Further, in some embodiments, the process comprises applying an etchant 804 to the interconnect dielectric layer 508 with the patterned photoresist layer 802 in place, and subsequently stripping the patterned photoresist layer 802 from the interconnect dielectric layer 508. In some embodiments, the channel pads 412c serve as etch stops during the first etch.

Figure 9:
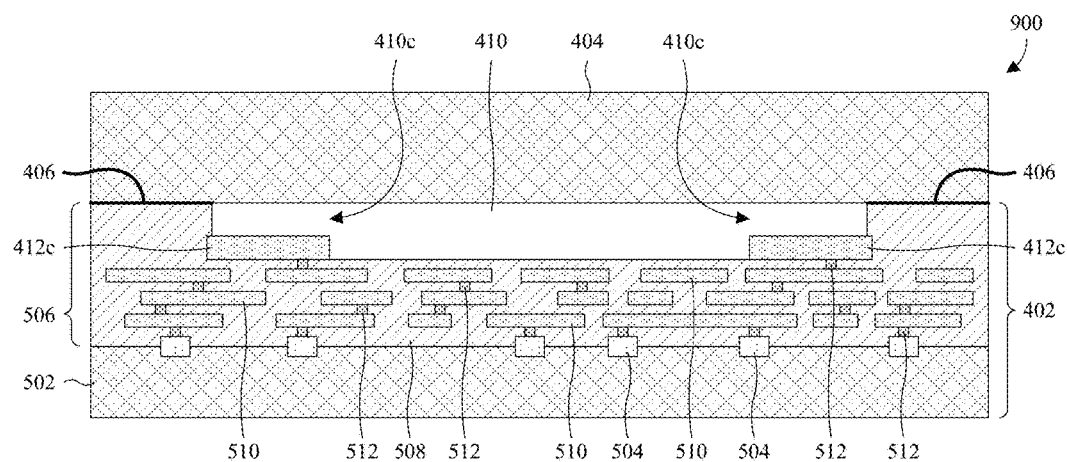

As illustrated by the cross-sectional view 900 of FIG. 9, a MEMS substrate 404 is arranged over and bonded to the support structure 402 at a bond interface 406. In some embodiments, the bond interface 406 is formed by fusion bonding and/or the bond interface 406 is a location at which a bottom surface of the MEMS substrate 404 interfaces with a top surface of the interconnect dielectric layer 508. Further, in some embodiments, the bonding hermetically seals the cavity 410. The cavity 410 may, for example, be hermetically sealed with a high reference pressure. The high reference pressure may, for example, be a pressure greater than about 500, 750, or 1100 millibars, and/or may, for example, be between about 500-1100, 500-750, 750-100, or 250-750 millibars. Further, after the bonding, the high reference pressure may, for example, be different than an ambient pressure of the MEMS package that is at the upper side 404u of the MEMS substrate 404. The MEMS substrate 404 may be or comprise, for example, monocrystalline silicon, polycrystalline silicon, amorphous silicon, aluminum copper, oxide, silicon nitride, or a combination of the foregoing.

Figure 10:
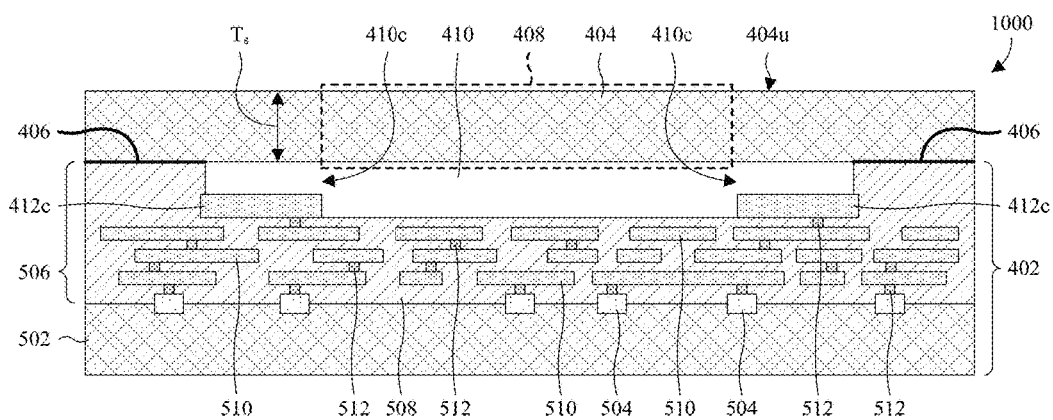

As illustrated by the cross-sectional view 1000 of FIG. 10, in some embodiments, the MEMS substrate 404 is thinned to a thickness $T_s$. The thickness $T_s$ may, for example, be between about 0.1-40.0 micrometers, about 0.1-10 micrometers, about 10-30 micrometers, about 15-25 micrometers, about 5-15 micrometers, or about 25-35 micrometers. The thinning may, for example, be performed by chemical mechanical polishing (CMP).

Also illustrated by the cross-sectional view 1000 of FIG. 10, the MEMS substrate 404 comprises a MEMS device 408 overlying the cavity 410. The MEMS device 408 may be, for example, a pressure sensor, and/or may, for example, move within the cavity 410 based on a pressure difference between the cavity 410 and an upper side 404u of the MEMS substrate 404. In some embodiments, the MEMS device 408 is formed in the MEMS substrate 404 before the MEMS substrate 404 is bonded to the support structure 402 at FIG. 9. In other embodiments, the MEMS device 408 is formed in the MEMS substrate 404 after the MEMS substrate 404 is thinned to the thickness $T_s$ at FIG. 10. In yet other embodiments, the MEMS device 408 is formed in the MEMS substrate 404 between the bonding and the thinning.

Figure 11:
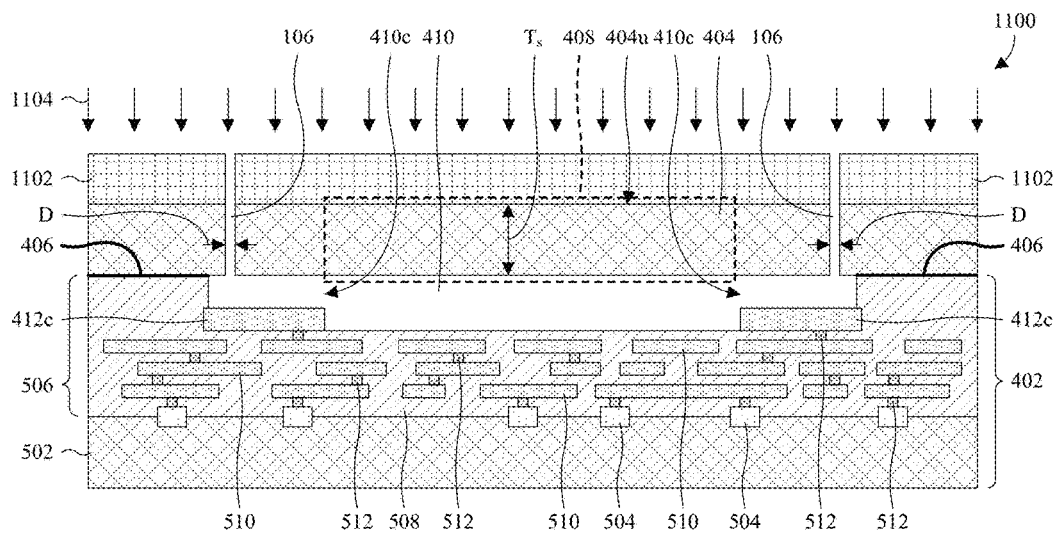

As illustrated by the cross-sectional view 1100 of FIG. 11, a second etch is performed into the MEMS substrate 404 to form a pair of vent openings 106 extending through MEMS substrate 404, from the upper side 404u of the MEMS substrate 404 to the cavity 410. In some embodiments, the second etch breaks a hermetic seal of the cavity 410 to equalize a pressure in the cavity 410 with a pressure on the upper side 404u of the MEMS substrate 404. The vent openings 106 may, for example, be on opposite sides of the cavity 410, and/or may, for example, respectively overlie the channels 410c of the cavity 410. Further, the vent openings 106 may, for example, have a rectangular, a triangular, a circular, an oval-shaped, a hexagonal-shaped, a square-shaped layout, or some other layout. In some embodiments, the vent openings 106 each have a layout as shown in FIG. 2A or FIG. 2B.

Minimum dimensions D individual to the vent openings 106 may, for example, each be between about 0.1-2.0 micrometers, about 0.05-5.0 micrometers, about 0.5-1.5 micrometers, about 1.0-1.5 micrometers, or about 0.1-1.0 micrometers. Further yet, the minimum dimensions D of the vent openings 106 may, for example, be greater than or equal to about $1/20^{th}$ of the thickness $T_s$ of the MEMS substrate 404 or about $1/30^{th}$ of the thickness $T_s$ of the MEMS substrate 404, and/or may, for example, be between about $1/15^{th}$-$1/25^{th}$ of the thickness $T_s$ of the MEMS substrate 404, about $1/18^{th}$-$1/22^{th}$ of the thickness $T_s$ of the MEMS substrate 404, or about $1/10^{th}$-$1/30^{th}$ of the thickness $T_s$ of the MEMS substrate 404.

In some embodiments, a process for performing the second etch comprises forming a patterned photoresist layer 1102 on the MEMS substrate 404. The patterned photoresist layer 1102 is formed with a pattern of openings corresponding to the vent openings 106 and may, for example, be patterned with photolithography. Further, in some embodiments, the process comprises applying an etchant 1104 to the MEMS substrate 404 with the patterned photoresist layer 1102 in place to transfer the pattern of openings to the MEMS substrate 404. Further yet, in some embodiments, the process comprises stripping the patterned photoresist layer 1102 from the MEMS substrate 404 after the second etch.

Figure 12A:
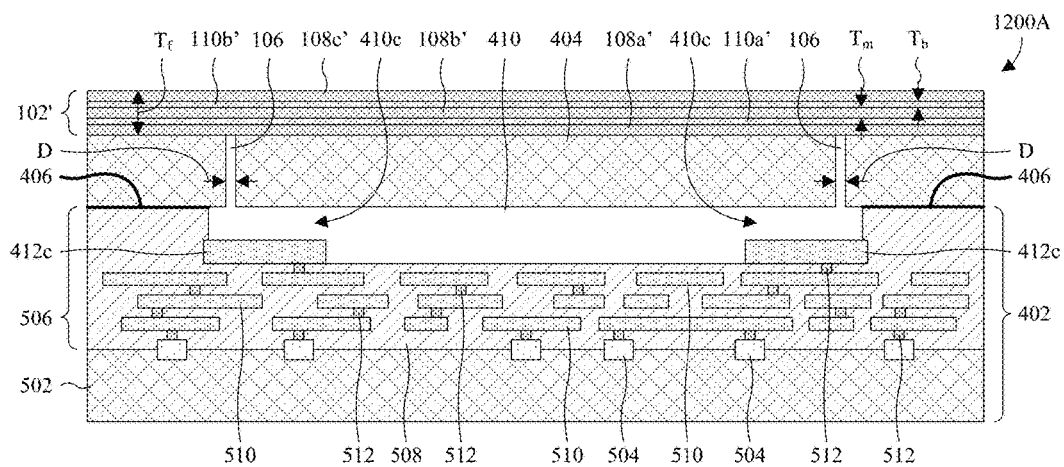

As illustrated by the cross-sectional view 1200A of FIG. 12A, a multi-layer sealing film 102' is formed covering the MEMS substrate 404 and the vent openings 106, and further sealing the vent openings 106 and the cavity 410. In some embodiments, the vent openings 106 and the cavity 410 are sealed with a low pressure. The low pressure may, for example, be less than about 10, 100, 250, or 500 millibars, and/or less than a pressure at which the bonding at FIG. 7 is performed. Further, the low pressure may, for example, be between about 0.001-10.000 millibar, about 10-500 millibar, about 0.001-1.000 millibar, or about 10-100 millibar. The multi-layer sealing film 102' comprises a first metal layer 108a', a first barrier layer 110a', a second metal layer 108b', a second barrier layer 110b', and a third metal layer 108c'.

The first metal layer 108a' is over the MEMS substrate 404. The first barrier layer 110a' is over the first metal layer 108a'. The second metal layer 108b' is over the first barrier layer 110a'. The second barrier layer 110b' is over the second metal layer 108b'. The third metal layer 108c' is over the second barrier layer 110b'. The first, second, and third metal layers 108a'-108c' are metals with grain sizes larger than those of the first and second barrier layers 110a', 110b', and the first and second barrier layers 110a', 110b' are metals or ceramics that have grain sizes smaller than those of the first, second, and third metal layers 108a'-108c'. For example, the first, second, and third metal layers 108a'-108c' may be aluminum copper, copper, or some other metal, and the first and second barrier layers 110a', 110b' may be titanium nitride, titanium tungsten, tungsten nitride, tantalum nitride, or some other barrier layer.

In some embodiments, the first, second, and third metal layers 108a'-108c' each have a thickness $T_m$ between about 0.5-1.5 micrometers, about 0.8-1.2 micrometers, or about 0.1-5 micrometers, and/or the first and second barrier layers 110a', 110b' each have a thickness $T_b$ between about 1100-2000 angstroms, about 1250-1750 angstroms, or about 500-5000 angstroms. For example, the thickness $T_m$ of the first, second, and third metal layers 108a'-108c' may be about 1.0 micrometers and the thickness $T_b$ of the first and second barrier layers 110a', 110b' may be about 1500 angstroms. In some embodiments, the first, second, and third metal layers 108a'-108c' and the first and second barrier layers 110a', 110b' have a combined thickness $T_f$ greater than about half of the minimum dimensions D of the vent openings 106, and/or between about 2.5-3.0 micrometers, about 2.7-3.3 micrometers, or about 1.0-5.0 micrometers.

In some embodiments, a process for forming the multi-layer sealing film 102' comprising performing a series of growth and/or deposition processes to sequentially form the layers of the multi-layer sealing film 102'. The growth or deposition processes may include, for example, chemical vapor deposition (CVD), physical vapor deposition (PVD), electron beam PVD, electroplating, electroless plating, some other growth or deposition process, or a combination of the foregoing. Further, the growth and/or deposition processes may, for example, be performed at the low pressure at which the cavity 410 is to be sealed.

Advantageously, re-sealing the vent openings 106 and the cavity 410 with the multi-layer sealing films 102 may allow the vent openings 106 and the cavity 410 to have the low pressure. Namely, where the bonding at FIG. 9 is performed by fusion bonding, the cavity 410 may be limited to an initial pressure that is high since fusion bonding is performed at high pressures. Such high pressures may, for example, be greater than about 500, 600, 750, or 1100 millibars. Further, since the multi-layer sealing film 102' may be formed at the low pressure, the re-sealing allows the vent openings 106 and the cavity 410 to have the low pressure.

Figure 12B:
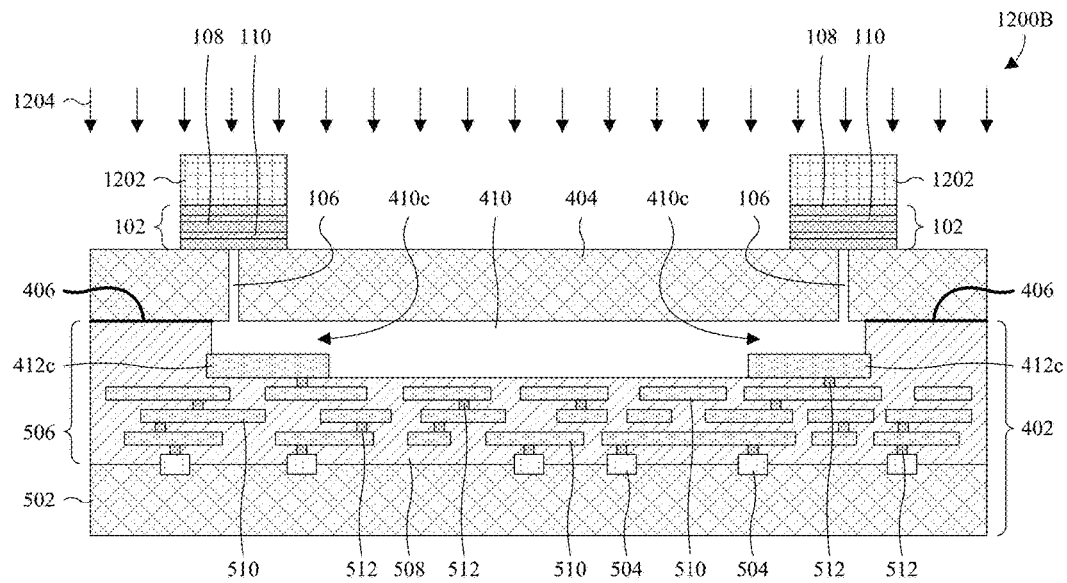

As illustrated by the cross-sectional view 1200B of FIG. 12B, in some embodiments, a third etch is performed into the multi-layer sealing film 102' (see FIG. 12A) to form a pair of individual multi-layer sealing films 102 respectively covering the vent openings 106, and further sealing the vent openings 106 and the cavity 410. The individual multi-layer sealing films 102 each comprise a plurality of individual metal layers 108 and a plurality of individual barrier layers 110 alternatingly stacked with the individual metal layers 108. For ease of illustration, only some of the individual metal layers 108 are labeled 108, and only some of the individual barrier layers 110 are labeled 110.

In some embodiments, a process for performing the third etch comprises forming a patterned photoresist layer 1202 on the multi-layer sealing film 102. The patterned photoresist layer 1202 is formed with a pattern of openings corresponding to gaps between the individual multi-layer sealing films 102 and may, for example, be patterned with photolithography. Further, in some embodiments, the process comprises applying an etchant 1204 to the multi-layer sealing film 102' with the patterned photoresist layer 1202 in place to transfer the pattern of openings to the multi-layer sealing film 102'. Further yet, in some embodiments, the process comprises stripping the patterned photoresist layer 1202 after the third etch.

As discussed above, after the individual multi-layer sealing films 102 are formed, seams may form at the vent openings 106. The individual barrier layers 110 advantageously stop or limit the seams from extending completely through the individual multi-layer sealing films 102 and breaking the seals. Accordingly, yield may be high during bulk manufacture of the MEMS package, and the reliability of the individual multi-layer sealing films 102 may be high. Further, material costs may be low since a thickness of the individual multi-layer sealing films 102 may be small while still achieve a high yield.

While FIGS. 12A and 12B illustrate the formation of individual multi-layer sealing films 102 with three metal layers and two barrier layers, the individual multi-layer sealing films 102 may be formed with more or less metal and barrier layers in other embodiments. For example, FIGS. 13A and 13B illustrate the formation of the individual multi-layer sealing films 102 with two metal layers and one barrier layer.

Figure 13A:
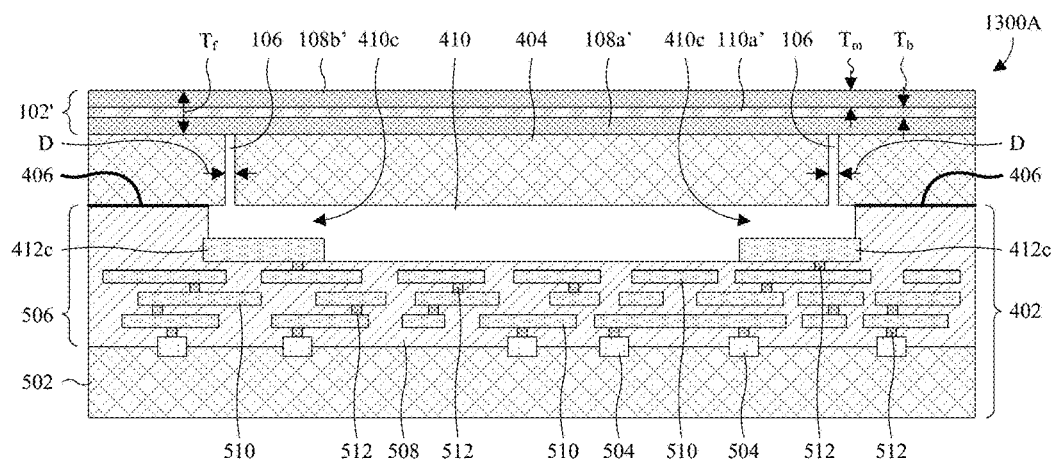

As illustrated by the cross-sectional view 1300A of FIG. 13A, the multi-layer sealing film 102' is formed with the first metal layer 108a', the first barrier layer 110a', and the second metal layer 108b', but not the second barrier layer 110b' (see FIG. 12A) and the third metal layer 108c' (see FIG. 12A). Further, the thickness $T_m$ of the first and second metal layers 108a', 108b' may be, for example, about 1.25-1.75 micrometers, such as 1.5 micrometers, and the thickness $T_b$ of the first barrier layer 110a' may be about 1500 angstroms.

Figure 13B:
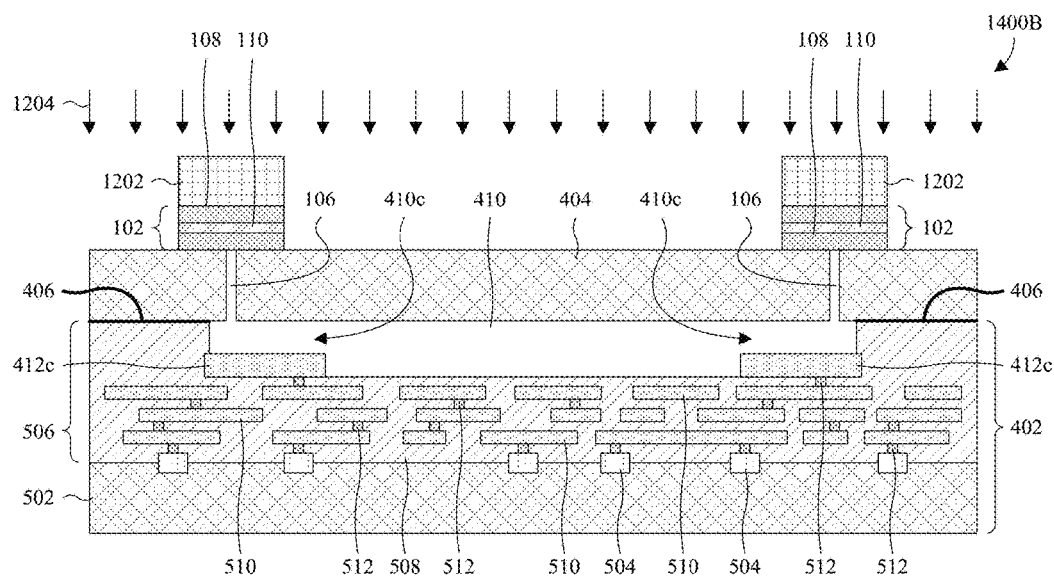

As illustrated by the cross-sectional view 1300B of FIG. 13B, in some embodiments, the individual multi-layer sealing films 102 are formed respectively covering the vent openings 106, and further sealing the vent openings 106 and the cavity 410. Further, the individual multi-layer sealing films 102 each comprise a plurality of individual metal layers 108 and a single individual barrier layer 110 alternatingly stacked with the individual metal layers 108. For ease of illustration, only some of the individual metal layers 108 are labeled 108.

Figure 14:
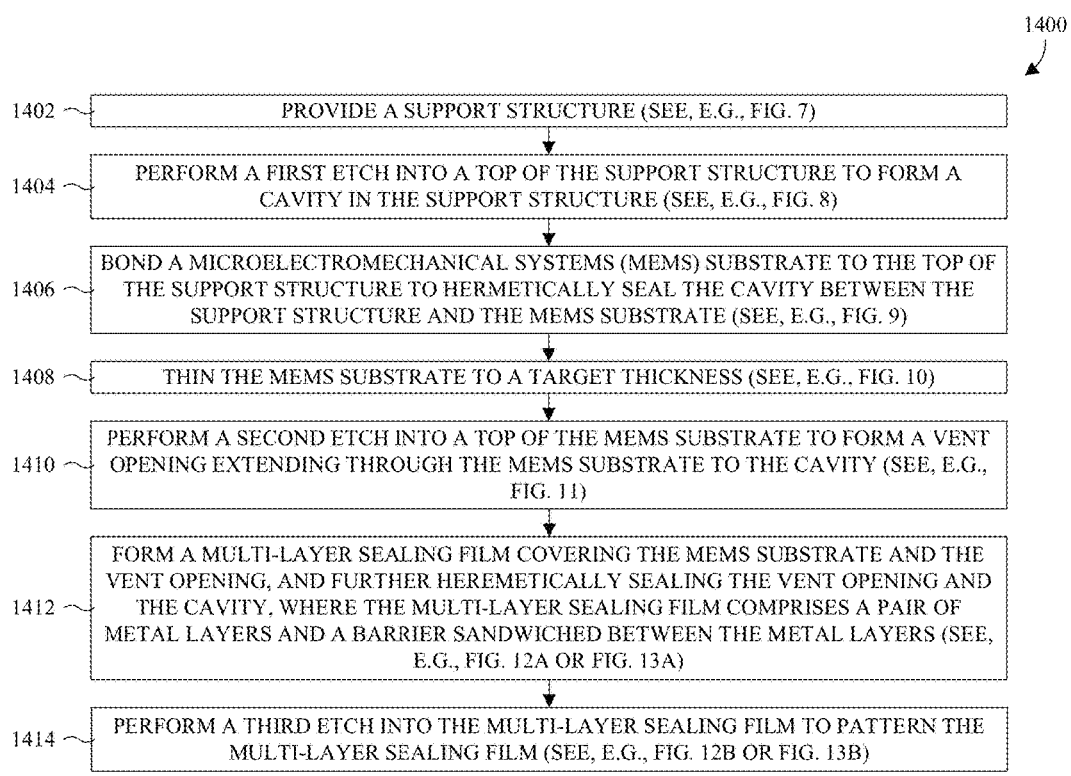
FIG. 14 illustrates a flowchart of some embodiments of the method of FIGS. 7-11, 12A, 12B, 13A, and 13B.

With reference to FIG. 14, a flowchart 1400 of some embodiments of the method of FIGS. 7-11, 12A, 12B, 13A, and 13B is provided.

At 1402, a support structure is provided. See, for example, FIG. 7.

At 1404, a first etch is performed into a top of the support structure to form a cavity in the support structure. See, for example, FIG. 8.

At 1406, a MEMS substrate is bonded to the top of the support structure to hermetically seal the cavity between the support structure and the MEMS substrate. See, for example, FIG. 9.

At 1408, the MEMS substrate is thinned to a target thickness. See, for example, FIG. 10.

At 1410, a second etch is performed into a top of the MEMS substrate to form a vent opening extending through the MEMS substrate to the cavity. See, for example, FIG. 11.

At 1412, a multi-layer sealing film is formed covering the MEMS substrate and the vent opening, and further hermetically sealing the vent opening and the cavity. The multi-layer sealing film comprises a pair of metal layers and a barrier layer sandwiched between the metal layers. See, for example, FIG. 12A or FIG. 13A. The barrier layer advantageously stops or limits a seam from extending through the multi-layer sealing film, from the vent opening, and breaking the seal of the multi-layer sealing film.

At 1414, a third etch is performed into the multi-layer sealing film to pattern the multi-layer sealing film. See, for example, FIG. 12B or FIG. 13B)

While the flowchart 1400 of FIG. 14 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In view of the foregoing, some embodiments of the present application provide a MEMS package including a support structure, a MEMS substrate, and a multi-layer sealing film. The MEMS substrate is over and bonded to the support structure. The support structure and the MEMS substrate define a cavity between the support structure and the MEMS substrate. The MEMS substrate includes a vent opening extending through the MEMS substrate, from an upper side of the MEMS substrate to the cavity. The multi-layer sealing film covers and seals the vent opening to prevent a first pressure on the upper side of the MEMS substrate from equalizing with a second pressure in the cavity through the vent opening. The multi-layer sealing film includes a pair of metal layers and a barrier layer sandwiched between metal layers. In an embodiment, the barrier layer is conductive and includes a metal or a ceramic, and the metal or the ceramic has a grain size less than a grain size of the metal layers. In an embodiment, the metal layers includes aluminum or copper, and the barrier layer includes titanium or tantalum. In an embodiment, the pair of metal layers includes a first metal layer and a second metal layer; the barrier layer overlies and contacts the first metal layer; and the second metal layer overlies and contacts the barrier layer. In an embodiment, the MEMS package further includes a second barrier layer overlying and contacting the second metal layer; and a third metal layer overlying and contacting the second barrier layer. In an embodiment, the first metal layer includes a seam extending from the vent opening, along grain boundaries of the first metal layer, to the barrier layer, and the seam terminates at the barrier layer. In an embodiment, the cavity includes a channel; the channel extends laterally away from a bulk of the cavity in a first direction and along a length of the channel; the channel has a smaller width and a smaller depth than the bulk of the cavity; the vent opening overlies the channel, and the vent opening and the bulk of the cavity are on opposite sides of the channel. In an embodiment, the cavity includes a second channel; the second channel extends laterally away from the bulk of the cavity in a second direction and along a length of the second channel; the second direction is opposite the first direction; the second channel has a smaller width and a smaller depth than the bulk of the cavity; the MEMS substrate includes a second vent opening overlying the second channel; and the second vent opening and the bulk of the cavity are on opposite sides of the second channel. In an embodiment, the MEMS package further includes a conductive pad underlying the channel and defining a bottom surface of the channel. In an embodiment, the support structure includes a semiconductor substrate and an interconnect structure covering the semiconductor substrate; the interconnect structure includes an interconnect dielectric layer, vias, and wires; and the vias and the wires are alternatingly stacked in the interconnect dielectric layer.

Some embodiments of the present application provide a method for manufacturing a MEMS package. A first etch is performed into a support structure to form a cavity in the support structure. A MEMS substrate is bonded to the support structure to seal the cavity. A second etch is performed into the MEMS substrate to form a vent opening unsealing the cavity. A multi-layer sealing film is formed covering the vent opening, and further sealing the vent opening and the cavity. The multi-layer sealing film includes a pair of metal layers and a barrier layer sandwiched between metal layers. In an embodiment, the barrier layer is formed of a metal or ceramic with smaller grains that those of the metal layers. In an embodiment, the bonding hermetically seals the cavity with a first pressure; and the forming of the multi-layer sealing film seals the cavity with a second pressure different than the first pressure. In an embodiment, the second pressure is low compared to the first pressure. In an embodiment, the bonding is performed by fusion bonding a bottom surface of the MEMS substrate to a top surface of the support structure. In an embodiment, the support structure includes a semiconductor substrate and an interconnect structure; the interconnect structure covers the semiconductor substrate; the interconnect structure includes an interconnect dielectric layer, wires, vias, and pads; the wires, the vias, and the pads are stacked in the interconnect dielectric layer; and the first etch is performed directly into the interconnect dielectric layer. In an embodiment, the pads are at a top of the interconnect structure and include a pair of channel pads; the channel pads are laterally spaced; the first etch is performed into the interconnect dielectric layer to form the cavity between the channel pads and overlapping the channel pads; and the channel pads serve as an etch stop for the first etch. In an embodiment, the pair of metal layers include a first metal layer and a second metal layer; and the forming of the multi-layer sealing film includes forming the first metal layer covering the vent opening and the MEMS substrate, forming the barrier layer overlying and covering the first metal layer, and forming the second metal layer overlying and covering the barrier layer. In an embodiment, the forming of the multi-layer sealing film includes forming a second barrier layer overlying and covering the second metal layer; and forming a third metal layer overlying and covering the second barrier layer.

Some embodiments of the present application provide another MEMS package including a support structure, a MEMS substrate, and a pair of multi-layer sealing films. The support structure includes a semiconductor substrate and an interconnect structure. The interconnect structure covers the semiconductor substrate. The interconnect structure includes a dielectric layer, vias, wires, and a pair of channel pads. The vias, the wires, and the channel pads are stacked in the dielectric layer. The MEMS substrate is over and bonded to the interconnect structure. The interconnect structure and the MEMS substrate define a cavity laterally between the channel pads and vertically between the interconnect structure and the MEMS substrate. The MEMS substrate includes a MEMS device and a pair of vent openings. The vent openings extend through the MEMS substrate, from a top of the MEMS substrate to the cavity, and respectively overlie the channel pads. The channel pads are in the cavity. The multi-layer sealing films respectively cover and seal the vent openings to prevent a first pressure at the top of the MEMS substrate from equalizing with a second pressure in the cavity through the vent openings. The multi-layer sealing films each include a pair of metal layers and a barrier layer sandwiched between metal layers. The metal layers have larger metal grains than the barrier layer.

Some embodiments of the present application provide a semiconductor structure including a substrate and a multi-layer sealing film. The substrate includes a vent opening extending through the substrate, from an upper side of the substrate to a lower side of the substrate. The upper side of the substrate has a first pressure, and the lower side of the substrate has a second pressure different than the first pressure. The multi-layer sealing film covers and seals the vent opening to prevent the first pressure from equalizing with the second pressure through the vent opening. The multi-layer sealing film includes a pair of metal layers and a barrier layer sandwiched between metal layers. In an embodiment, the multi-layer sealing film further includes an additional barrier layer and an additional metal layer; the additional barrier layer overlies the metal layers and the barrier layer; and the additional metal layer overlies the additional barrier layer. In an embodiment, the barrier layer is metal or ceramic and has a grain size less than a grain size of the metal layers.

Some embodiments of the present application provide a method for manufacturing a semiconductor structure. A substrate is provided. The substrate has a first pressure on a lower side of the substrate and a second pressure on an upper side of the substrate. The lower and upper sides of the substrate are opposite, and the first and second pressures are different. A etch is performed into the substrate to form vent opening extending through the substrate, from the upper side of the substrate to the lower side of the substrate, and to further equalize the first and second pressures through the vent opening. A multi-layer sealing film is formed covering and sealing the vent opening. The multi-layer sealing film is formed at a third pressure different than the first pressure. The multi-layer sealing film includes a pair of metal layers and a barrier layer sandwiched between metal layers. In an embodiment, the barrier layer is formed of a metal or ceramic with smaller grains that those of the metal layers. In an embodiment, the metal layers are formed of aluminum or copper; and the barrier layer is formed of titanium or tantalum. In an embodiment, the forming of the multi-layer sealing film further includes forming an additional barrier layer overlying and covering the metal layers; and forming an additional metal layer overlying and covering the additional barrier layer.

Some embodiments of the present application provide another method for manufacturing a MEMS package. A support structure is provided. The support structure includes a semiconductor substrate, semiconductor devices recessed into a top of the semiconductor substrate, and an interconnect structure covering the semiconductor substrate and the semiconductor devices. The interconnect structure includes a dielectric layer and conductive features stacked in the dielectric layer. A first etch is performed into a top of the dielectric layer to form a cavity in the dielectric layer. The cavity has a T-shaped profile. A MEMS substrate is fusion bonded to the top of the dielectric layer to hermetically seal the cavity. The cavity is hermetically sealed with a first pressure. A second etch is performed into a top of the MEMS substrate to form a pair of vent openings unsealing the cavity. The vent openings are on opposite sides of the cavity. A multi-layer sealing film is formed covering and sealing the vent openings and the cavity. The multi-layer sealing film seals the vent openings and the cavity with a second pressure different than the first pressure. The multi-layer sealing film includes a pair of metal layers and a barrier layer sandwiched between metal layers. In an embodiment, the conductive features include a pair of channel pads at a top of the interconnect structure; the first etch is performed into the dielectric layer to form the cavity between the channel pads and overlapping the channel pads; and the channel pads serve as an etch stop for the first etch. In an embodiment, the multi-layer sealing film is formed at the second pressure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A microelectromechanical systems (MEMS) package comprising:
   a support structure;
   a MEMS substrate over and bonded to the support structure, wherein the support structure and the MEMS substrate define a cavity between the support structure and the MEMS substrate, and wherein the MEMS substrate comprises a vent opening extending through the MEMS substrate, from an uppermost surface of the MEMS substrate to the cavity; and
   a multi-layer sealing film covering and sealing the vent opening to prevent a first pressure on the uppermost surface of the MEMS substrate from equalizing with a second pressure in the cavity through the vent opening, wherein the multi-layer sealing film comprises a pair of metal layers and a barrier layer sandwiched between metal layers, and wherein the barrier layer has a bottommost surface that is above the uppermost surface of the MEMS substrate.

2. The MEMS package according to claim 1, wherein the barrier layer is conductive and comprises a metal or a ceramic, and wherein the metal or the ceramic has a grain size less than a grain size of the metal layers.

3. The MEMS package according to claim 1, wherein the metal layers comprise aluminum or copper, and wherein the barrier layer comprises titanium or tantalum.

4. The MEMS package according to claim 1, wherein the pair of metal layers comprises a first metal layer and a second metal layer, wherein the barrier layer overlies and contacts the first metal layer, and wherein the second metal layer overlies and contacts the barrier layer.

5. The MEMS package according to claim 4, further comprising:
  a second barrier layer overlying and contacting the second metal layer; and
  a third metal layer overlying and contacting the second barrier layer.

6. The MEMS package according to claim 4, wherein the first metal layer comprises a seam extending from the vent opening, along grain boundaries of the first metal layer, to the barrier layer, and wherein the seam terminates at the barrier layer.

7. The MEMS package according to claim 1, wherein the cavity comprises a channel, wherein the channel extends laterally away from a bulk of the cavity in a first direction and along a length of the channel, wherein the channel has a smaller width and a smaller depth than the bulk of the cavity, wherein the vent opening overlies the channel, and wherein the vent opening and the bulk of the cavity are on opposite sides of the channel.

8. The MEMS package according to claim 7, wherein the cavity comprises a second channel, wherein the second channel extends laterally away from the bulk of the cavity in a second direction and along a length of the second channel, wherein the second direction is opposite the first direction, wherein the second channel has a smaller width and a smaller depth than the bulk of the cavity, wherein the MEMS substrate comprises a second vent opening overlying the second channel, and wherein the second vent opening and the bulk of the cavity are on opposite sides of the second channel.

9. The MEMS package according to claim 7, further comprising a conductive pad underlying the channel and defining a bottom surface of the channel.

10. The MEMS package according to claim 1, wherein the support structure comprises:
  a semiconductor substrate; and
  an interconnect structure covering the semiconductor substrate, wherein the interconnect structure comprises an interconnect dielectric layer, vias, and wires, and wherein the vias and the wires are alternatingly stacked in the interconnect dielectric layer.

11. A microelectromechanical systems (MEMS) package comprising:
  a support structure comprising a semiconductor substrate and an interconnect structure, wherein the interconnect structure covers the semiconductor substrate, wherein the interconnect structure comprises a dielectric layer, vias, wires, and a pair of channel pads, and wherein the vias, the wires, and the channel pads are stacked in the dielectric layer;
  a MEMS substrate over and bonded to the interconnect structure, wherein the interconnect structure and the MEMS substrate define a cavity laterally between the channel pads and vertically between the interconnect structure and the MEMS substrate, wherein the MEMS substrate comprises a MEMS device and a pair of vent openings, wherein the vent openings extend through the MEMS substrate, from a top of the MEMS substrate to the cavity, and respectively overlie the channel pads, and wherein the channel pads are in the cavity; and
  a pair of multi-layer sealing films respectively covering and sealing the vent openings to prevent a first pressure at the top of the MEMS substrate from equalizing with a second pressure in the cavity through the vent openings, wherein the multi-layer sealing films each comprise a pair of metal layers and a barrier layer sandwiched between the metal layers, and wherein the metal layers have larger metal grains than the barrier layer.

12. The MEMS package according to claim 11, wherein the metal layers comprise aluminum or copper, and wherein the barrier layer comprises titanium or tantalum.

13. The MEMS package according to claim 11, wherein at least one of the multi-layer sealing films comprises a crack extending from a corresponding one of the vent openings to the barrier layer, and wherein the crack stops at the barrier layer.

14. The MEMS package according to claim 11, wherein the MEMS substrate is a bulk monocrystalline silicon substrate, and wherein the MEMS substrate completely defines a top surface of the cavity when viewed in cross section.

15. A semiconductor structure comprising:
  a first substrate supporting semiconductor devices;
  an interconnect structure covering the first substrate and the semiconductor devices, wherein the interconnect structure comprises an interconnect dielectric layer partially defining a cavity;
  a second substrate covering the cavity, wherein the second substrate comprises a vent opening extending from an upper side of the second substrate to the cavity; and
  a multi-layer sealing film covering the vent opening and sealing the cavity, wherein the multi-layer sealing film comprises a first metal layer over a second metal layer, and further comprises a barrier layer between the first and second metal layers, and wherein the second metal layer seals the vent opening and is in direct fluid communication with the cavity.

16. The semiconductor structure according to claim 15, wherein the multi-layer sealing film has a top layout that is rectangular.

17. The semiconductor structure according to claim 15, wherein the cavity comprises a channel extending laterally away from a bulk of the cavity, along a length of the channel, wherein the channel has a reduced height and a reduced width respectively relative to a maximum height and a maximum width of the cavity, and wherein the vent opening is directly over the channel.

18. The semiconductor structure according to claim 17, further comprising:
  an electrode in the cavity and defining a bottom surface of the channel, wherein an edge of the multi-layer sealing film directly overlies the electrode.

19. The semiconductor structure according to claim 15, wherein the first and second metal layers are aluminum copper, elemental aluminum, or elemental copper, and wherein the barrier layer is titanium nitride, titanium tungsten, or tantalum nitride.

20. The semiconductor structure according to claim 15, wherein the multi-layer sealing film comprises a third metal layer over the first and second metal layers, and wherein the multi-layer sealing film comprises a second barrier layer over the first and second metal layers and under the third metal layer.

* * * * *